Sept. 6, 1960 Z. T. DEARDEN 2,951,953

INVERTER CIRCUIT

Filed Dec. 30, 1958

INVENTOR.
ZIBA T. DEARDEN by Dewey J. Cunningham
ATTORNEY 2,951,953

INVERTER CIRCUIT

Ziba T. Dearden, Endicott, N.Y., assignor to International Business Machines Corporation, New York, N.Y., a corporation of New York Filed Dec. 30, 1958, Ser. No. 783,799

6 Claims. (Cl. 307—88.5)

The present invention relates to semiconductor signal translating apparatus and in particular to transistorized inverter circuits for use in digital computers.

A large share of the basic building blocks in a digital computer utilize an inverter circuit. In such a circuit, the particular signal translating device, whether it be a transistor or a vacuum tube, usually operates between two limits. Either the device is in its on or conducting state, or in its off or nonconducting state. In considering the use of a transistor in an inverter circuit, there are two main considerations. These considerations are switching time and efficiency. Switching time in going on is determined by the time interval between the leading edge of the input pulse and the leading edge of the output pulse plus the transient or rise time in the output pulse. Switching time in going off is determined by the time interval between the trailing edges of the input and output pulses plus the fall time in the output pulse. The efficiency of a transistorized inverter circuit may be defined as the ratio of the base current to the circuit input current.

Prior art voltage mode inverters utilizing transistors are normally connected in the grounded emitter configuration. That is, the emitter of the transistor is connected to a predetermined reference potential, not necessarily ground. The input signal is applied through a suitable resistor to the base of the transistor, there being a temperature compensating resistor connected from the base to a suitable supply voltage which, in the case of an NPN transistor, is more negative than the emitter voltage. The collector of the transistor is connected through a resistor to a D.C. supply voltage which is more positive, in the case of an NPN transistor, than the emitter voltage.

The operation of this prior art circuit is such that during the times when the transistor is cut off, the base is kept more negative than the emitter by the voltage divider action of the input resistor and the temperature compensating resistor. If the down level of the input voltage is somewhat higher than the emitter voltage, the temperature compensating resistor must be made small in order to maintain the base negative relative to the emitter. This requires considerable input current from the input source. When the input signal goes up to turn the transistor on, it is accomplished at a considerable drain on the input source due to the relatively small temperature compensating resistor.

The speed in turning the transistor off in a prior art circuit, such as that described above, is slow due to the fact that the transistor is saturated, and the minority carriers have to be removed from the base before collector current ceases to flow. It has been proposed in the past to tap the input resistor and connect this point to the plate of a diode having the cathode thereof connected to the collector of the transistor. Thus, when the collector drops to a predetermined value just prior to saturation, current flows through the diode in the forward direction from the tapped point to the collector so as to limit the base current to such a point that the transistor can go no further into conduction. Under these circumstances, the time to cut the transistor off is now less than where no saturation limiting is used.

The circuit using saturation limiting as described above has the same difficulty as the previously described inverter circuit where the down level of the input signal is somewhat higher than the emitter voltage. The result is considerable drain on the input source both when the transistor is cut off and when the transistor is conducting. In using transistors having a relatively high saturation resistance, the output voltage, even at its down level, is quite a bit more positive than the emitter voltage. Therefore, when an effort is made to couple this down level into another inverter, the designer is immediately faced with the problem of dropping the voltage at the base of the transistor in the next inverter so as to keep the transistor turned off when the input signal thereto is at its down level.

Another problem with such a saturation limiting arrangement as that described above is that the regulation thereof is difficult because of the changes in base current brought about by the fact that different transistors have different gains ($\beta$). This will be understood when it is realized that the required input current increases as transistor gain decreases, thus creating different voltage drops for different transistors, under the same input conditions, at the tapped point on the input resistor. The result is that a reduction in output current is necessary to tolerate the change in voltage without exceeding the maximum collector power dissipation across the transistor. Thus, the result of poor regulation is the use of a transistor having greater capability than can be utilized. With transistors having higher saturation resistances, the problem becomes acute. The driving capability of such a circuit is materially affected. Speed also decreases with lower driving capability when driving a capacitive load.

An object of the present invention is to provide a circuit arrangement utilizing transistors having high saturation resistance characteristics wherein more efficient use is made of the available input current than in known prior art circuits.

Another object of the invention is to provide a new and improved inverter circuit utilizing transistors having high saturation characteristics that may be cascade connected.

Another object of the invention is to provide a new and improved circuit utilizing a transistor having high saturation resistance characteristics which is capable of compensating for a considerably larger leakage current $I_{co}$ than prior art circuits.

Another object of the present invention is to provide a new and improved inverter circuit utilizing transistors having high saturation resistance characteristics wherein the overdrive voltage is considerably higher than prior art inverter circuits, the overdrive voltage being defined as the difference between the voltage toward which the inverter input charges and the voltage needed to saturate the worst transistor encountered.

Still another object of the present invention is to provide a new and improved inverter circuit utilizing transistors having a high saturation resistance wherein better noise rejection capability is achieved than in prior art circuits.

A further object of the present invention is to provide a new and improved circuit arrangement, as described above, having input current requirements which are considerably less than prior art circuits.

A still further object of the present invention is to provide a transistorized circuit, as described above, which is faster and considerably more efficient than prior art circuits of the same general type.

Other objects of the invention will be pointed out in the following description and claims and illustrated in the accompanying drawings, which disclose, by way of examples, the principle of the invention and the best mode, which has been contemplated, of applying that principle.

Figure 1:
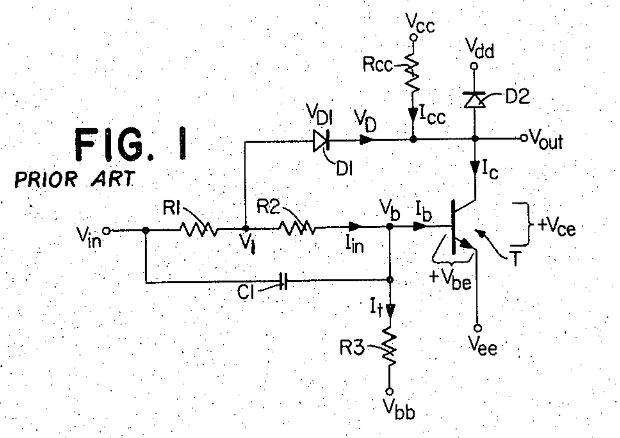
FIG. 1 PRIOR ART
Fig. 1 shows a conventional prior art resistance type inverter circuit utilizing saturation limiting.

The prior art circuit shown in Fig. 1 comprises an NPN transistor T which has its emitter connected to a reference voltage $V_{ee}$. The collector of the transistor is connected through a resistor R*cc* to a voltage $V_{cc}$ which is positive relative to the emitter voltage. The input voltage $V_{in}$ is applied through resistors R1 and R2 to the base of the transistor, there being a temperature compensating resistor R3 connected from the base to a voltage $V_{bb}$ which is more negative than the emitter voltage. A speed-up capacitor C1 is connected from the input terminal to the base. The plate of diode D1 is connected to a point intermediate resistors R1 and R2, and the cathode of said diode is connected to the collector. A clamping diode D2 is utilized to prevent the output signal at the collector from going more positive than the reference voltage $V_{dd}$, the last mentioned voltage being more positive than the emitter voltage but somewhat less than the voltage $V_{cc}$.

The symbols used in Fig. 1 to define currents and voltages not previously referred to are defined as follows:

$V_1$=voltage at a point between resistors R1 and R2
$V_b$=voltage at the base of the transistor
$V_{be}$=base-to-emitter voltage
$V_{ce}$=collector-to-emitter voltage
$V_{D1}$=voltage across diode D1
$I_{in}$=current passing through resistor R2
$I_b$=current into base
$I_t$=current through R3
$I_{D1}$=current supplied to the collector through D1
$I_{cc}$=current flowing through R*cc*
$I_c$=collector current
$I_c=I_{cc}+I_{D1}$
$I_{total}$=total input current to the inverter The operation of this circuit, as previously described, is such that when the input voltage $V_{in}$ is at its down level, the transistor is cut off. To accomplish this, the input voltage is dropped across resistors R1, R2 and R3 in order to keep the base voltage $V_b$ below the emitter voltage. The value of R1 and R2 must be made small to keep the transistor conducting properly during the up level of $V_{in}$ and R3 must be made small to keep the transistor cut off during the down level of $V_{in}$.

Where the transistor T has a relatively high saturation resistance, the output voltage from the collector, $V_{out}$, will be somewhat higher than the emitter voltage $V_{ee}$. This determines, of course, the down voltage for the next stage. Therefore, $V_{in}$ will be somewhat higher than the emitter voltage $V_{ee}$. This makes it necessary to have R1, R2, and particularly R3, smaller than would be desirable.

A desirable design would be to have the size of R3 determined only by the transistor leakage current $I_{co}$ so that R3 can be as large as possible. The total input current $I_{total}$ should be equal to the base current $I_b$ under ideal conditions. Unfortunately, where the down level of $V_{in}$ is larger than $V_{ee}$, due to a high saturation resistance and/or other circuit coupling effects, the input voltage must be dropped across R1 and R2 so as to make $V_b$ more negative than $V_{ee}$. Thus, in order to do this, R3 must be decreased. From the equation $$I_{total}=I_b+I_t+I_D \quad (1)$$

it will be seen that a decrease in R3 will cause an increase in $I_t$ so as to raise the total input current requirement. In turning the transistor on, it is desirable that the down level of $V_{out}$ be equal to the down level of $V_{in}$. Since R3 had to be reduced, $I_t$ will be increased, thereby making $I_{total}$ considerably larger than $I_b$. Thus, a large portion of the input current does not reach the base. This results in loss of efficiency or over-all stage gain. The maximum stage gain which can be realized is $\beta$. This is equal to $$\frac{I_c}{I_b}$$

Stage gain $A_i$ may be defined as follows:

$$A_i=\frac{I_c}{I_b+I_t}=\frac{\beta}{1+\frac{I_t}{I_b}} \quad (2)$$

Since $I_t$ is high relative to $I_b$, the stage gain $A_i$ will be low for the prior art circuit of Fig. 1.

As previously mentioned, when the transistor goes into conduction, if the collector tries to go below the voltage $V_1$ intermediate resistors R1 and R2, current will flow through diode D1, thereby limiting the base current $I_b$ to such a point that the transistor can go no further into conduction. If a transistor having a different $\beta$ is used while saturation limiting is working, difficulty is encountered. For example, as $\beta$ of a transistor goes up, the voltage $V_1$, decreases. The input current $I_{in}$ varies inversely with $\beta$. From the equation $$V_1=V_{be}+I_{in}R2 \quad (3)$$

It will be seen that as $I_{in}$ varies, $V_1$ varies directly therewith, thereby causing $V_{out}$ to also vary. In the equation $$V_{ce}=I_{in}R+V_{be}-V_{D1} \quad (4)$$

it is known that $I_{in}=I_b+I_t$. Also, it is known that $$I_b=\frac{I_c}{\beta}$$

Therefore, by substitution, $$V_{ce}=\left(\frac{I_c}{\beta}+I_t\right)R2+V_{be}-V_{D1} \quad (5)$$

From Equation 5 it is apparent that a decrease in $\beta$ is reflected into an increase in $V_{ce}$. The equation for collector power dissipation is as follows:

$$P_c=V_{ce}I_c \quad (6)$$

From this equation it will be seen that an increase in $V_{ce}$ causes an increase in power dissipation, thereby resulting in a decrease in efficiency.

Figure 2:
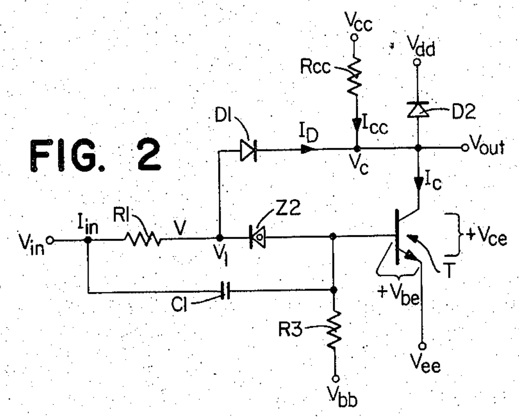
Fig. 2 shows a first embodiment of the new and improved circuit arrangement of the present invention.

For a detailed description of the present invention, reference is made to Fig. 2 which discloses a first form of the present invention. There is provided a transistor T, shown as an NPN transistor in the illustrated embodiment having its emitter connected to a predetermined reference potential $V_{ee}$. The collector of the transistor is connected through a resistor R*cc* to a relatively positive supply voltage $V_{cc}$. The collector is clamped in a conventional manner by a diode D2 to prevent the collector from rising above a reference potential $V_{dd}$, which is somewhat lower than the voltage $V_{cc}$ during transistor cut off. The input voltage $V_{in}$ is applied through resistor R1 to the cathode of a threshold or breakdown type diode Z2, also known as a Zener diode. The plate of the last mentioned diode is connected to the base of the transistor, there being a temperature compensating resistor R3 connected from the base to a voltage source $V_{bb}$ which is negative relative to the emitter voltage $V_{ee}$. A coupling capacitor C1 is connected in shunt with R1 and Z2. The cathode of the Zener diode is also connected to the plate of a conventional diode D1, the cathode of the last mentioned diode being connected to the collector of the transistor.

Figure 4:
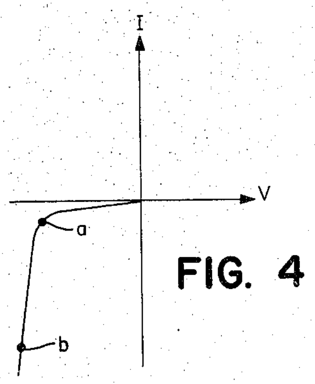
Fig. 4 shows a voltage-current characteristic curve for a threshold or breakdown diode usable with the present invention.

The Zener type diode Z2 is of the type which presents a low forward resistance and, in the reverse direction, presents a high resistance throughout a preassigned voltage range, known as the Zener voltage $V_Z$, and then a very low variational resistance for reverse voltages beyond this range. A typical characteristic curve for such a diode is shown in Fig. 4. For example, with a reverse biasing voltage equal to the threshold, or Zener voltage, across the diode, the current flowing therethrough will place the diode at point *a* on its characteristic curve. This is the approximate breakdown point of the device. It will be seen that a further increase in current flow to bring the device down to point *b* results in a negligible increase in voltage across the device.

In dealing with transistors having relatively high saturation resistances, such as silicon transistors, the collector-to-emitter voltage $V_{ce}$ during transistor conduction is chosen to be greater than the saturation voltage $V_s$. The saturation voltage may be defined as that voltage developed between the collector and emitter with a specified collector current which will cause the transistor to operate within its saturation region. A typical transistor, the 2N338, has a saturation voltage of approximately 1.5 volts for 10 milliamperes collector current at room temperature. Therefore, any voltage $V_{ce}$, greater than the saturation voltage of 1.5 volts, will not allow the transistor to operate in its saturation region. The input voltage $V_{in}$, which the present invention can accept, may vary considerably in both its down and up levels. For example, one design might be for a minimum down voltage of zero volts and a maximum down voltage of 6 volts; i.e., $V_{D\ (min.)}=0$, and $V_{D\ (max.)}=6$. The up levels of the input voltage for a typical circuit may be $V_{U\ (min.)}=12$, and $V_{U\ (max.)}=16$. Such variations in the input voltage $V_{in}$ may be attributable to voltage changes in going through passive logic from one inverter to the next. For example, $V_{out}$ from one inverter may be on the order of 1.6 volts. By the time this voltage is passed through a few logic circuits, it may be in the order of 4 or 5 volts.

The Zener diode is chosen for each circuit such that its threshold or breakdown voltage is approximately equal to the $V_{D\ (max.)}-V_{ee}$. In the case under consideration where $V_{in}=V_{D\ (max.)}=6$ and $V_{ee}=0$, the Zener diode would be chosen with a threshold or Zener voltage of 6 volts. Thus, with 6 volts applied across the Zener diode, the diode will be operating at point *a* on the characteristic curve shown in Fig. 4. Zener diodes are not always obtainable with as ideal a characteristic curve such as that shown in Fig. 4. It is often difficult to determine just where the threshold occurs. Although it is preferable to operate at the knee or breakdown point of the characteristic curve, it is sometimes necessary to operate at a lower voltage than the defined Zener voltage with less efficiency.

The value of the temperature compensating resistor R3 is chosen according to the equation $$R3=\frac{V_{be}-V_{bb}}{I_{co}+I_{ZL}} \qquad (7)$$

where $I_{ZL}$ is the leakage current through the Zener diode when the input voltage is at $V_{D\ (max.)}$. With the above defined values for the Zener diode and the temperature compensating resistor R3, the worst conditions during the down level of $V_{in}$ will find the base voltage no higher than the emitter voltage $V_{ee}$. In other words, if an emitter voltage $V_{ee}$ of zero volts is chosen, the base voltage would be no higher than ground for $V_{D\ (max.)}$. This voltage is insufficient to place the transistor into conduction. The current drain on the input source is small and equal to $I_{ZL}$ during this time. It will be noted that the selection of the value of R3 is independent of the value of R1. This is in contrast to the prior art circuit.

When $V_{in}$ increases to its up level, the voltage at the base of the transistor increases accordingly, causing the transistor to begin conduction. It will be noted from Fig. 4 that a substantial increase in current through the Zener diode results in relatively small increase in the voltage across the Zener diode. As $V_{in}$ rises, a substantial voltage drop is developed across R1 and a substantial current is available at the base. This is particularly true since R3 may be made relatively large in the present invention since it does not have to be small, as in the prior art resistance type inverter, in order to put the base below the emitter voltage during transistor cut off. As soon as the collector voltage $V_c$ decreases to the point where current flows through diode D1, the base current into the transistor will not appreciably increase further. Therefore, the transistor cannot go into saturation. The equation for selecting R1 is as follows:

$$R1=\frac{V_U-V_{Z2}-V_b}{I_b+I_t} \qquad (8)$$

The equation for $V_{ce}$ for the Fig. 2 circuit is as follows:

$$V_{ce}=V_{Z2}+V_{be}-V_{D1} \qquad (9)$$

Assuming that $V_{be}$ equals 1 volt and $V_{D1}$ equals 1, the collector-to-emitter voltage $V_{ce}$ will be equal to $$6+1-1=6 \text{ volts.}$$

This is well above the 1.5 volts' saturation voltage of the transistor.

In the prior art circuit Equation 5 illustrated that a change in $\beta$ results in a change in $V_{ce}$. That is, for the same circuit, using a transistor having a $\beta$ different from the previous $\beta$ results in a change in the collector-to-emitter voltage $V_{ce}$. Thus, as $\beta$ decreases, $V_{ce}$ increases, causing greater power dissipation in the transistor. In the circuit of the present invention, Equation 9 shows that $V_{ce}$ is independent of $\beta$. Therefore, transistors of different $\beta$ values may be substituted without change in power dissipation.

Figure 3:
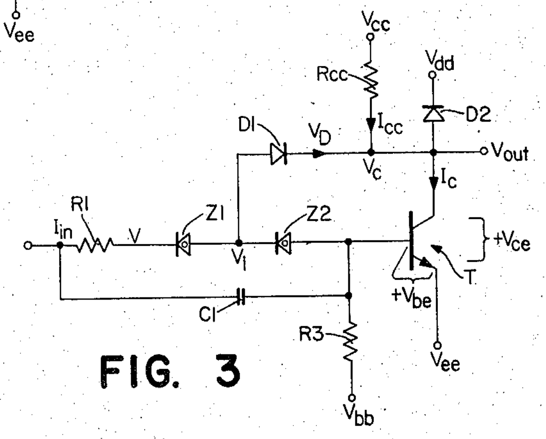
Fig. 3 shows a second embodiment of the present invention.

The circuit shown in Fig. 3 differs from the circuit shown by Fig. 2 by the addition of a Zener diode Z1 between the input resistor R1 and the previous Zener diode Z2. The plate of diode D1 is connected to a point between Zener diodes Z1 and Z2. The operation of this circuit is generally similar to the Fig. 2 circuit. However, the Fig. 3 circuit possesses a definite advantage over the Fig. 2 circuit in that a collector-to-emitter voltage of lower value may be achieved. Selection of the Zener voltage value of Z2 is obtained from Equation 8, a value of $V_{ce}$ being chosen to be greater than the saturation voltage $V_s$ at the highest expected temperature condition. For example, assuming values of $V_{ce}=3$, $V_{be}=1$, and $V_{D1}=1$, the Zener diode breakdown voltage $V_{Z2}$ would equal 3 volts. The threshold values of Z1 and Z2 should be chosen to be equal to the maximum down level of the input voltage, assuming the emitter is connected to ground. In other words, $V_{Z1}+V_{Z2}$ is chosen to equal $V_{D\ (max.)}-V_{ee}$. Therefore, in the previous illustration, the threshold voltage Z1 would be equal to $$6-0-3=3=V_{Z1}.$$

Using the above selected values, $V_{ce}$ in the Fig. 3 circuit will be equal to 3 volts and therefore the transistor cannot saturate. This is less than in the case of Fig. 2 where $V_{ce}=6$. From the Equation 6 it will be apparent that a decrease in $V_{ce}$ results in a decrease in $P_c$. Thus, the transistor is used more efficiently than in the previous circuits.

The over-all stage gain for the circuits in Fig. 2 and Fig. 3 is considerably better than was the case in Fig. 1. It will be remembered from Equation 2 that in the Fig. 1 circuit $I_t$ was large relative to $I_b$, thereby resulting in a relatively low stage gain. However, in the circuits of the present invention, resistor R3 was made large since its design was predicated primarily by $I_{co}+I_{ZL}$ which was relatively small. This means that the current $I_t$ will be very small relative to $I_b$ so that the stage gain $A_i$, as illustrated in Equation 2, will approach a maximum.

From the above detailed description it will be seen that I have provided a transistorized inverter circuit capable of faster switching times, and greater efficiency in power dissipation of the transistor as well as overall stage gain, than prior art inverter circuits utilizing transistors. The circuit of the present invention is particularly useful with transistors having relatively high saturation resistance.

A particular advantage of the present invention is the fact that only a small leakage current is used during the down level of the input voltage, which down level can vary over a wide range. In conjunction with this, when the up level of the input voltage is applied, a substitute amount of the available current is supplied as base current only. There is not the large drain on the input source through the temperature compensating resistor during either the down or up level.

Further, inasmuch as the resistors R1 and R3 have comparatively little effect on the input characteristic, greater tolerance may be permitted on the circuit components. This has the effect of increasing circuit reliability.

While the invention has been shown as using an NPN type transistor for purposes of illustration, it will be understood by those persons skilled in the art that the invention is applicable to circuits utilizing a PNP transistor. It is only a matter of reversing voltage polarities and diode orientation, and possible changes in the values of parameters due to different transistor characteristics.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the invention, therefore, to be limited only as indicated by the scope of the following claims.

What is claimed is:

1. An inverter circuit comprising a transistor having an emitter, a base and a collector, a load impedance connected between the collector and a collector supply voltage, said emitter being connected to a fixed reference voltage, a temperature compensating impedance connected between the base and a base bias voltage, an input path comprising the series connection of a resistor and a Zener diode means between an input terminal and said base, an input signal supplied to said input terminal having a first voltage level in response to which level said transistor is cut off and a second voltage level in response to which said transistor conducts, said Zener diode means being oriented so that a high impedance is offered to current flow therethrough when the first voltage level is applied to the input terminal and a low impedance to current flow therethrough during said second voltage level, and a diode connected between said input path and said collector, said diode being oriented so that it can conduct prior to saturation of the transistor and limit the base current during the second voltage level at said input terminal.

2. An inverter comprising a transistor having an emitter, a base and a collector, a load impedance connected between the collector and a collector supply voltage, said emitter being connected to a fixed reference voltage, a temperature compensating impedance connected between the base and a base bias voltage, an input path comprising the series connection of a resistor and Zener diode means between an input terminal and said base, an input signal supplied to said input terminal having a first voltage level in response to which level said transistor is cut off and a second voltage level in response to which said transistor conducts, said Zener diode means being oriented so that a high impedance is offered to current flow therethrough when the first voltage level is applied to the input terminal and a low impedance to current flow therethrough during said second voltage level, and a diode connecting the input side of said Zener diode means with said collector, said diode being oriented so that it can conduct prior to saturation of the transistor and limit the base current during the second voltage level at said input terminal.

3. An inverter circuit comprising a transistor having an emitter, a base and a collector, a load impedance connected between the collector and a collector supply voltage, said emitter being connected to a fixed reference voltage, a temperature compensating impedance connected between the base and a base bias voltage, an input path comprising the series connection of an input terminal, resistor means and threshold responsive means, the last named means being connected to said base, an input signal supplied to said input terminal having a first voltage level which varies within limits and in response to which level said transistor is cut off and a second voltage level in response to which said transistor conducts, said threshold responsive means being characterized by a low resistance condition for voltages thereacross of a predetermined polarity and magnitude exceeding a preassigned threshold value and a high resistance condition for voltages of said predetermined polarity and of a magnitude less than said preassigned value, said threshold responsive means being oriented such that the polarity of the voltage thereacross is of said predetermined polarity, and a diode connected between said input path and said collector, said diode being oriented so that it can conduct prior to saturation of the transistor and limit the base current during the second voltage level of said input, said assigned threshold value of said threshold responsive means being substantially equal to the difference between the maximum value of said first input voltage level and said fixed reference voltage to which said emitter is connected.

4. An inverter circuit comprising a transistor having an emitter, a base and a collector, a load impedance connected between the collector and a collector supply voltage, said emitter being connected to a fixed reference voltage, a temperature compensating impedance connected between the base and a base bias voltage, an input circuit comprising the series connection of a resistor and at least one Zener diode between an input terminal and said base, an input signal supplied to said input terminal having a first voltage level in response to which level said transistor is cut off and a second voltage level in response to which said transistor conducts, said Zener diode having a threshold voltage of a preassigned value such that a high impedance to current flow therethrough is offered as long as the voltage at said input terminal is at said first level and a low impedance is offered to current flow therethrough when said input terminal is at said second level, and a diode connected between said collector and a point in said input path on the input side of said Zener diode in order to limit the base current during transistor conduction and thereby prevent transistor saturation.

5. An inverter circuit comprising a transistor having an emitter, a base and a collector, a load impedance connected between the collector and a collector supply voltage, said emitter being connected to a fixed reference voltage, a temperature compensating impedance connected between the base and a base bias voltage, an input circuit comprising the series connection of a resistor and first and second Zener diodes between an input terminal and said base, an input signal supplied to said input terminal and said base, an input signal supplied to said input terminal having a first voltage level which varies within limits and in response to which level said transistor is cut off and a second voltage level in response to which said transistor conducts, said first and second Zener diodes being reverse biased during both of said input voltage levels, the sum of the breakdown voltages of said first and second Zener diodes being substantially equal to the difference in voltage between the maximum value of said first voltage level and said fixed reference voltage connected to said emitter, the breakdown voltage of said second Zener diode having a preassigned value greater than the maximum saturation voltage of said transistor, and a diode connected to a point between said first and second Zener diodes and to said collector, said diode being oriented to conduct prior to transistor saturation to limit the base current during transistor conduction.

6. An inverter circuit comprising a transistor having an emitter, a collector and a base, a load impedance connected between the collector and a collector supply voltage, said emitter being connected directly to a fixed reference voltage, a temperature compensating impedance connected between the base and a base bias voltage, an input circuit connected to said base and adapted to receive an input signal, said input circuit including a resistor and a threshold device serially connected together, said threshold device being characterized by a first low resistance condition for voltages thereacross which are of one polarity and any magnitude, by a second low resistance for voltages thereacross which are of the opposite polarity and of any magnitude exceeding a preassigned threshold value, and by an intermediate high resistance condition, said resistor being connected to receive said input signal and said threshold device being connected to said base, said threshold device being oriented so that it is in said intermediate condition when the input signal is insufficient to turn the transistor into conduction and in said second condition when said input signal is sufficient, and a diode connecting said input circuit to said collector and oriented to limit the base current into the transistor during transistor conduction.

No references cited.

UNITED STATES PATENT OFFICE

CERTIFICATE OF CORRECTION

Patent No. 2,951,953 September 6, 1960

Ziba T. Dearden

It is hereby certified that error appears in the printed specification of the above numbered patent requiring correction and that the said Letters Patent should read as corrected below.

Column 8, lines 68 and 69, strike out "an input signal supplied to said input terminal and said base,".

Signed and sealed this 11th day of April 1961.

(SEAL)
Attest:
ERNEST W. SWIDER

Attesting Officer

ARTHUR W. CROCKER
Acting Commissioner of Patents